United States Patent
Tanaka et al.

(10) Patent No.: US 10,734,900 B2
(45) Date of Patent: Aug. 4, 2020

(54) CONVERTER DEVICE, MOTOR DRIVE DEVICE, REFRIGERATOR, AIR CONDITIONER, AND HEAT-PUMP WATER HEATER

(71) Applicant: Mitsubishi Electric Corporation, Tokyo (JP)

(72) Inventors: Akito Tanaka, Tokyo (JP); Satoru Ichiki, Tokyo (JP); Tomohiro Kutsuki, Tokyo (JP); Daisuke Suzuki, Chonburi (TH); Akira Sakai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/339,049

(22) PCT Filed: Dec. 28, 2016

(86) PCT No.: PCT/JP2016/089073
§ 371 (c)(1),
(2) Date: Apr. 3, 2019

(87) PCT Pub. No.: WO2018/123008
PCT Pub. Date: Jul. 5, 2018

(65) Prior Publication Data
US 2019/0312510 A1    Oct. 10, 2019

(51) Int. Cl.
*H02M 3/158*    (2006.01)
*F24F 1/0007*    (2019.01)
(Continued)

(52) U.S. Cl.
CPC ............. *H02M 3/158* (2013.01); *F24D 3/18* (2013.01); *F24F 1/00073* (2019.02);
(Continued)

(58) Field of Classification Search
CPC .............................. H02P 27/08; H02M 3/158
(Continued)

(56) References Cited

U.S. PATENT DOCUMENTS

| | | | |
|---|---|---|---|
| 7,271,564 B2 * | 9/2007 | Ramu | ...................... H02K 1/24 |
| | | | 318/254.1 |
| 9,462,647 B2 | 10/2016 | Fukui et al. | |
| 2016/0226415 A1 | 8/2016 | Yamaguchi et al. | |

FOREIGN PATENT DOCUMENTS

| | | |
|---|---|---|
| EP | 2 579 446 A2 | 4/2013 |
| EP | 3 059 846 A1 | 8/2016 |

(Continued)

OTHER PUBLICATIONS

Office Action dated Dec. 23, 2019 issued in corresponding AU patent application No. 2016434774.
(Continued)

*Primary Examiner* — David Luo
(74) *Attorney, Agent, or Firm* — Posz Law Group, PLC

(57) ABSTRACT

A converter device includes a rectifier circuit to rectify an AC voltage output from an AC power supply, a booster circuit including a plurality of reactors, a plurality of switching elements, and a plurality of backflow prevention elements to boost an output voltage of the rectifier circuit, a smoothing capacitor to smooth an output voltage of the booster circuit, a bus-current detection circuit to detect a value of a current that flows between the rectifier circuit and the booster circuit, a first filter circuit having a first filter time constant, a second filter circuit having a second filter time constant shorter than the first filter time constant, and a control unit to control an operation of the switching elements as a current value detected by the bus-current detection circuit is input to the control unit via the first filter circuit and the second filter circuit.

5 Claims, 2 Drawing Sheets

(51) Int. Cl.

| | |
|---|---|
| *F24D 3/18* | (2006.01) |
| *F25B 31/02* | (2006.01) |
| *H02M 1/08* | (2006.01) |
| *H02P 27/08* | (2006.01) |
| *H02M 1/42* | (2007.01) |
| *H02M 3/155* | (2006.01) |
| *H02M 1/00* | (2006.01) |
| *G01R 19/00* | (2006.01) |

(52) U.S. Cl.
CPC ............ *F25B 31/026* (2013.01); *H02M 1/08* (2013.01); *H02M 1/4208* (2013.01); *H02M 1/4225* (2013.01); *H02M 3/155* (2013.01); *H02M 3/1584* (2013.01); *H02P 27/08* (2013.01); *G01R 19/0092* (2013.01); *H02M 2001/0009* (2013.01); *H02M 2003/1586* (2013.01); *H02P 2201/09* (2013.01); *H02P 2201/15* (2013.01); *Y02B 70/126* (2013.01)

(58) Field of Classification Search
USPC .................................................. 318/504, 494
See application file for complete search history.

(56) References Cited

FOREIGN PATENT DOCUMENTS

| JP | 2007-195282 A | 8/2007 |
| JP | 2015-118006 A | 6/2015 |

OTHER PUBLICATIONS

International Search Report of the International Searching Authority dated Feb. 28, 2017 for the corresponding international application No. PCT/JP2016/089073 (and English translation).

Extended European Search Report dated Oct. 26, 2018 issued in corresponding EP patent application No. 16904245.4.

* cited by examiner

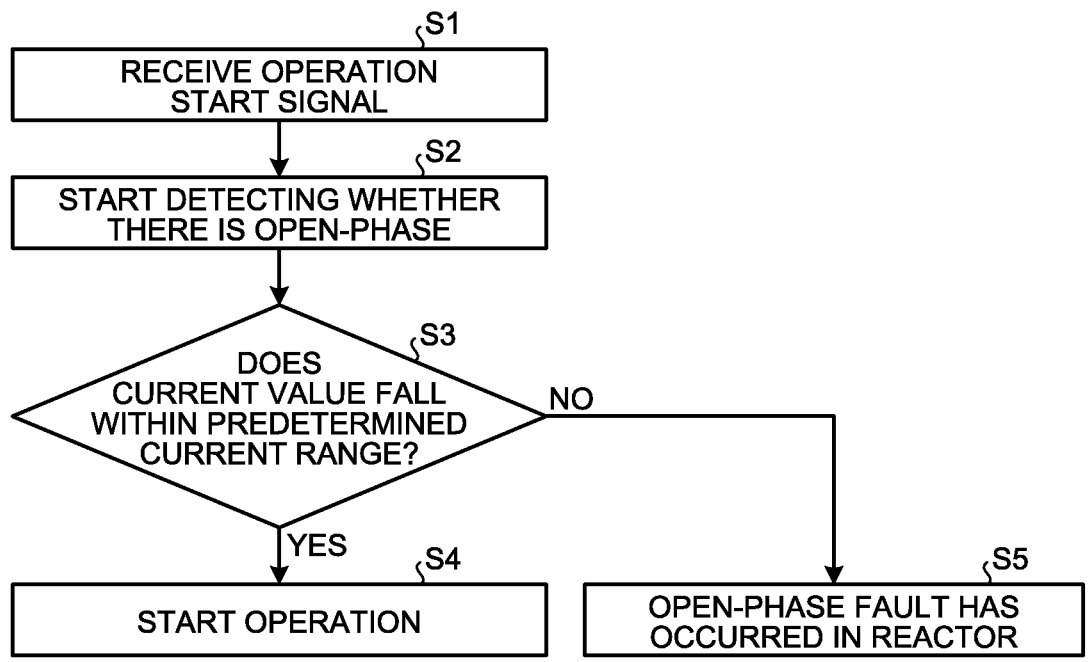
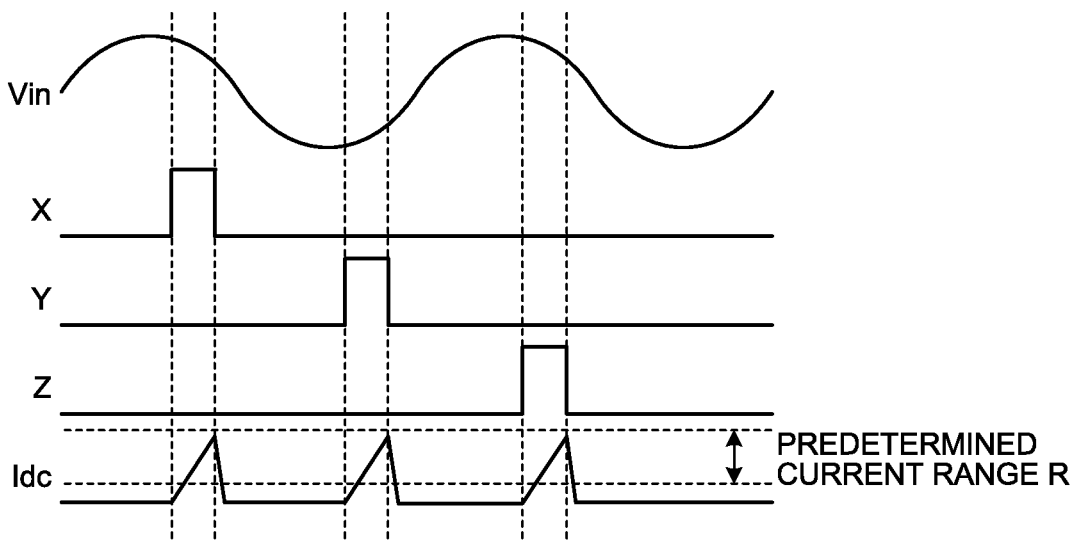

CONVERTER DEVICE, MOTOR DRIVE DEVICE, REFRIGERATOR, AIR CONDITIONER, AND HEAT-PUMP WATER HEATER

CROSS REFERENCE TO RELATED APPLICATION

This application is a U.S. national stage application of International Patent Application No. PCT/JP2016/089073 filed on Dec. 28, 2016, the disclosure of which is incorporated herein by reference.

TECHNICAL FIELD

The present invention relates to a converter device that includes a plurality of reactors, and to a motor drive device, a refrigerator, an air conditioner, and a heat-pump water heater.

BACKGROUND

In a power supply device disclosed in Patent Literature 1, the output of a rectifier circuit is branched into a plurality of current paths, and a plurality of series circuits are provided in parallel, each of which is configured by a reactor and a switching element. When the switching element is off, a current in the reactor provided in each of the series circuits is supplied to a smoothing capacitor via a backflow prevention diode. The switching elements provided in the respective series circuits are driven individually at a different phase. Due to this operation, a current that flows via each of the switching elements is suppressed, and also ripple components in a current output from each of the reactors are suppressed.

PATENT LITERATURE

Patent Literature 1: Japanese Patent Application Laid-open No. 2007-195282

In such a conventional power supply device represented by Patent Literature 1, a current value, detected by a bus-current detection circuit that detects a value of the current output from the rectifier circuit, is output to an RC filter. The RC filter has a relatively long time constant of several tens of microseconds [μs] to several hundreds of microseconds [μs]. Therefore, it is difficult to detect an open-phase in the reactor that has a small inductance value, and that is used in a plurality of booster circuits, based on the current value detected by the bus-current detection circuit.

SUMMARY

The present invention has been achieved to solve the above problems, and an object of the present invention is to provide a converter device that can detect an open-phase in a booster circuit regardless of the value of a reactor that constitutes the booster circuit.

To solve the above problems and achieve the object, a converter device according to the present invention includes: a rectifier circuit to rectify an AC voltage output from an AC power supply; a booster circuit including a plurality of reactors, a plurality of switching elements, and a plurality of backflow prevention elements to boost an output voltage of the rectifier circuit; a smoothing capacitor to smooth an output voltage of the booster circuit; a current detection circuit to detect a value of a current that flows between the rectifier circuit and the booster circuit; a first filter circuit having a first filter time constant; a second filter circuit having a second filter time constant shorter than the first filter time constant; and a control unit to control an operation of the plurality of switching elements by inputting a current value detected by the current detection circuit to the control unit via the first filter circuit and the second filter circuit.

The converter device according to the present invention has an effect where it is possible to detect an open-phase in a booster circuit regardless of the value of a reactor that constitutes the booster circuit.

BRIEF DESCRIPTION OF DRAWINGS

FIG. 2 is an explanatory flowchart of an operation in a control unit illustrated in FIG. 1 to detect an open-phase in a reactor.

FIG. 3 is an explanatory diagram of the details of the control in the control unit illustrated in FIG. 1.

DETAILED DESCRIPTION

Figure 1:
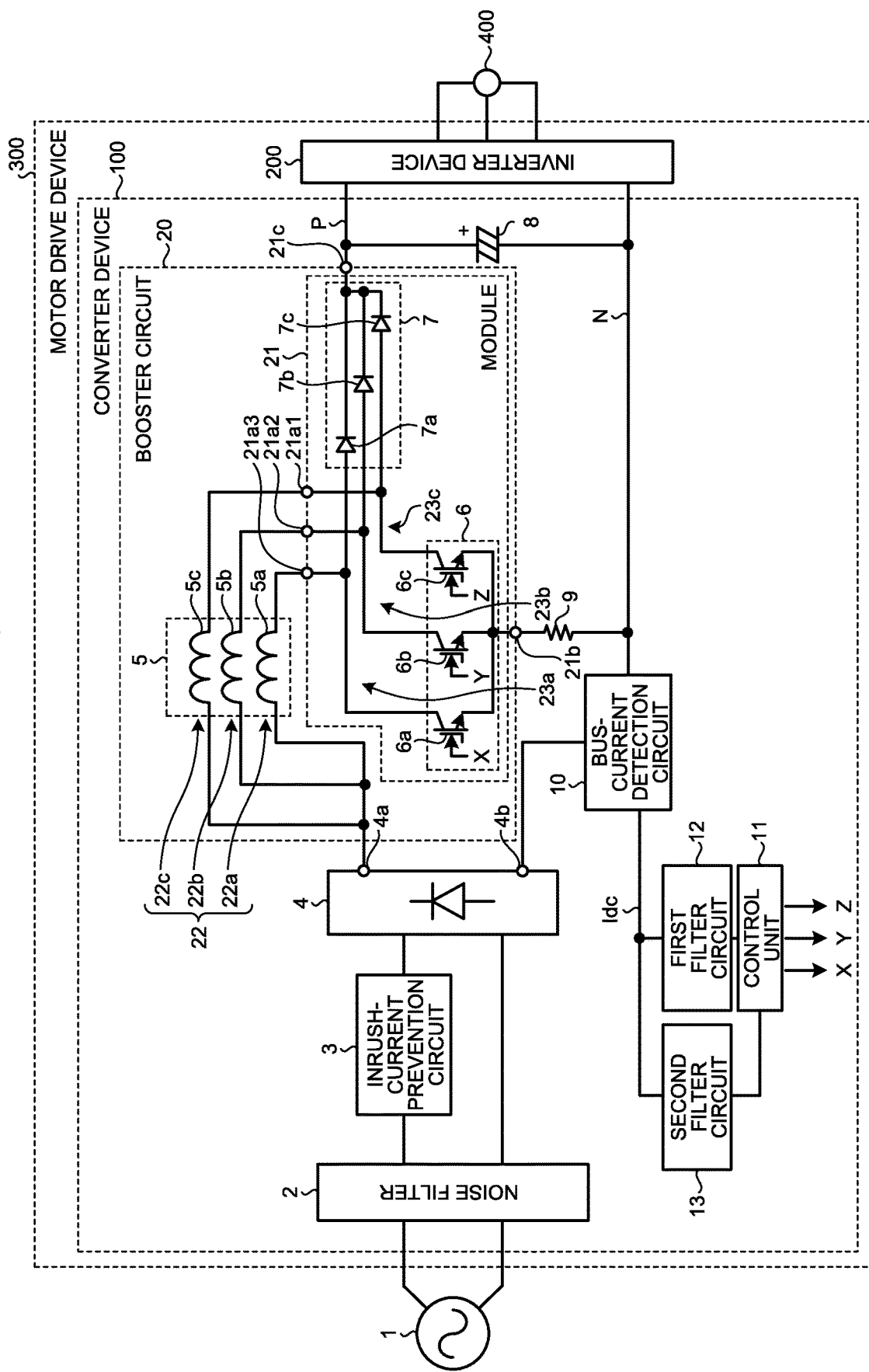
FIG. 1 is a configuration diagram of a converter device and a motor drive device according to an embodiment of the present invention.

A converter device, a motor drive device, a refrigerator, an air conditioner, and a heat-pump water heater according to an embodiment of the present invention will be described in detail below with reference to the accompanying drawings. The present invention is not limited to the embodiment.

Embodiment

FIG. 1 is a configuration diagram of a converter device and a motor drive device according to an embodiment of the present invention. A motor drive device 300 according to the present embodiment is a device that converts AC power, supplied from an AC power supply 1 that is a single-phase AC power supply, to DC power, and then converts the DC power to AC power to supply the AC power to a motor 400 that is a load. As the motor 400, a three-phase synchronous motor or a three-phase induction motor that is incorporated in a refrigerator, an air conditioner, or a heat-pump water heater can be exemplified.

The motor drive device 300 includes: a converter device 100 that converts AC power to DC power, and outputs the DC power; and an inverter device 200 that converts DC power, output from the converter device 100, to AC power, and supplies the AC power to the motor 400.

The converter device 100 includes: an inrush-current prevention circuit 3 that prevents an inrush current; a noise filter 2 that is provided between the AC power supply 1 and the inrush-current prevention circuit 3, and that reduces high-frequency noise superimposed on a current output from the AC power supply 1, a rectifier circuit 4 that rectifies an AC voltage output from the AC power supply 1 via the noise filter 2 and the inrush-current prevention circuit 3, a booster circuit 20 that boosts a voltage rectified by the rectifier circuit 4; a smoothing capacitor 8 that smooths a voltage boosted by the booster circuit 20; a shunt resistance 9 that is used for detecting a bus current; a bus-current detection circuit 10 that is a current detection circuit connected to a negative output terminal 4b of the rectifier circuit 4; a first filter circuit 12 that has a first filter time constant; a second filter circuit 13 that has a second filter time constant shorter than the first filter time constant; and a control unit 11.

The bus-current detection circuit 10 detects a bus current Idc that is a value of the bus current that flows from the rectifier circuit 4 to the inverter device 200, or a value of the bus current that flows from the inverter device 200 to the rectifier circuit 4, and then outputs the detected bus current Idc to the first filter circuit 12 and the second filter circuit 13. The bus current Idc indicates a voltage that corresponds to the value of the bus current.

As the rectifier circuit 4, a full-wave rectifier circuit configured by combining four diodes can be exemplified. The rectifier circuit 4 may be configured by combining MOSFETs (Metal Oxide Semiconductor-Field Effect Transistors) other than the diodes.

The booster circuit 20 includes a module 21, and a reactor group 5 that is connected at one end to a positive output terminal 4a of the rectifier circuit 4.

The reactor group 5 is constituted by three reactors 5a, 5b, and 5c that are connected in parallel. Each of the three reactors 5a, 5b, and 5c is connected at one end to the positive output terminal 4a of the rectifier circuit 4. The other end of the reactor 5a is connected to a first input terminal 21a3 of the module 21. The other end of the reactor 5b is connected to a second input terminal 21a2 of the module 21. The other end of the reactor 5c is connected to a third input terminal 21a1 of the module 21. While a core with reduced harmonic iron losses is used in each of the three reactors 5a, 5b, and 5c, the core may be selected by taking into account the factors such as a method for controlling the booster circuit 20 by the control unit 11, power conversion efficiency of the converter device 100, the amount of heat generated in the booster circuit 20, the weight of the converter device 100, and the volume of the converter device 100.

The module 21 includes a MOSFET group 6 that is a group of switching elements, and a diode group 7. The module 21 is a bridge circuit in which three series circuits 23a, 23b, and 23c are connected in parallel. The MOSFET group 6 is constituted by three switching elements that are MOSFETs 6a, 6b, and 6c. The diode group 7 is constituted by three backflow prevention diodes 7a, 7b, and 7c.

The series circuit 23a is a circuit in which the MOSFET 6a and the backflow prevention diode 7a are connected in series. The series circuit 23b is a circuit in which the MOSFET 6b and the backflow prevention diode 7b are connected in series. The series circuit 23c is a circuit in which the MOSFET 6c and the backflow prevention diode 7c are connected in series.

A drain of the MOSFET 6a is connected to an anode of the backflow prevention diode 7a. A source of the MOSFET 6a is connected to a negative output terminal 21b. The negative output terminal 21b is connected to one end of the shunt resistance 9. The other end of the shunt resistance 9 is connected to a negative DC busbar N. A PWM (Pulse Width Modulation) drive signal X generated by the control unit 11 is input to a gate of the MOSFET 6a. The PWM drive signal X is a signal that causes the MOSFET 6a to perform an on-off operation. A cathode of the backflow prevention diode 7a is connected to a positive output terminal 21c. The positive output terminal 21c is connected to a positive DC busbar P.

A drain of the MOSFET 6b is connected to an anode of the backflow prevention diode 7b. A source of the MOSFET 6b is connected to the negative output terminal 21b. A PWM drive signal Y generated by the control unit 11 is input to a gate of the MOSFET 6b. The PWM drive signal Y is a signal that causes the MOSFET 6b to perform an on-off operation. A cathode of the backflow prevention diode 7b is connected to the positive output terminal 21c.

A drain of the MOSFET 6c is connected to an anode of the backflow prevention diode 7c. A source of the MOSFET 6c is connected to the negative output terminal 21b. A PWM drive signal Z generated by the control unit 11 is input to a gate of the MOSFET 6c. The PWM drive signal Z is a signal that causes the MOSFET 6c to perform an on-off operation. A cathode of the backflow prevention diode 7c is connected to the positive output terminal 21c.

The positive output terminal 21c is connected to a positive terminal of the smoothing capacitor 8 and to the inverter device 200. A negative terminal of the smoothing capacitor 8 is connected to the bus-current detection circuit 10, to the other end of the shunt resistance 9, and to the inverter device 200.

The reactor 5a, the MOSFET 6a, and the backflow prevention diode 7a constitute a first chopper circuit 22a. The reactor 5b, the MOSFET 6b, and the backflow prevention diode 7b constitute a second chopper circuit 22b. The reactor 5c, the MOSFET 6c, and the backflow prevention diode 7c constitute a third chopper circuit 22c.

The reactor 5a is connected to the MOSFET 6a and the backflow prevention diode 7a via the first input terminal 21a3. The reactor 5b is connected to the MOSFET 6b and the backflow prevention diode 7b via the second input terminal 21a2. The reactor 5c is connected to the MOSFET 6c and the backflow prevention diode 7c via the third input terminal 21a1.

In the converter device 100 configured as described above, AC power supplied from the AC power supply 1 is input to the rectifier circuit 4 via the noise filter 2 and the inrush-current prevention circuit 3, and then full-wave rectification is performed on the AC power input to the rectifier circuit 4. Power having undergone full-wave rectification in the rectifier circuit 4 is boosted in the booster circuit 20. The power boosted in the booster circuit 20 is smoothed by the smoothing capacitor 8 and then supplied to the inverter device 200. The inverter device 200 converts a DC voltage smoothed by the smoothing capacitor 8 to an AC voltage, and drives the motor 400.

The bus current Idc detected by the bus-current detection circuit 10 is input to the first filter circuit 12 and the second filter circuit 13.

The first filter circuit 12, provided between the bus-current detection circuit 10 and the control unit 11, is an RC filter to be used for detecting a bus current during a normal operation. The RC filter has a first filter time constant. The first filter time constant is several tens of microseconds [μs] to several hundreds of microseconds [μs]. The first filter circuit 12 outputs a value of the bus current Idc, detected by the bus-current detection circuit 10, to the control unit 11 as a signal for a feedback control.

The second filter circuit 13, provided between the bus-current detection circuit 10 and the control unit 11, is an RC filter to be used for detecting an open-phase in a reactor. The RC filter has a second filter time constant. The second filter time constant is several microseconds [μs]. The second filter circuit 13 outputs a value of the bus current Idc detected by the bus-current detection circuit 10 to the control unit 11.

Next, an operation of the control unit 11 will be described.

In the initial state, the control unit 11 has stopped the MOSFET group 6. Before running a normal control sequence, the control unit 11 turns on three MOSFETs 6a, 6b, and 6c that constitute the MOSFET group 6 in the described order at a predetermined power phase for a predetermined number of seconds. Due to this operation, a current flows in the respective phases. That is, a current flows in the first chopper circuit 22a, the second chopper circuit 22b, and the third chopper circuit 22c, respectively.

A current having flowed via each chopper circuit is detected by the bus-current detection circuit 10. The detected bus current Idc is input to the control unit 11 via the first filter circuit 12 and the second filter circuit 13.

As described above, the first filter circuit 12 has an RC filter time constant longer than that of the second filter circuit 13. Therefore, the control unit 11 cannot use the bus current Idc, input via the first filter circuit 12 to the control unit 11, as a current for accurately detecting an open-phase in a reactor. However, because the RC filter time constant of the second filter circuit 13 is shorter than that of the first filter circuit 12, the control unit 11 can use the bus current Idc, input via the second filter circuit 13, as a current for accurately detecting an open-phase in a reactor.

In the manner as described above, at the time of detecting an open-phase in a reactor, the control unit 11 reads the bus current Idc input via the second filter circuit 13, and thereby determines whether a predetermined current flows in each of the first chopper circuit 22a, the second chopper circuit 22b, and the third chopper circuit 22c. Therefore, the control unit 11 can determine whether there is an open-phase.

However, it is obvious that when the control unit 11 runs a normal control sequence, the second filter circuit 13 with a shorter RC filter time constant cannot completely remove noise generated during an on-off operation of the switching elements. Accordingly, in a case where the control unit 11 uses the bus current Idc input via the second filter circuit 13, it is difficult for the control unit 11 to detect an accurate bus current. Consequently, when the control unit 11 runs a normal control sequence, the control unit 11 uses the bus current Idc input via the first filter circuit 12 to execute a feedback control.

FIG. 2 is an explanatory flowchart of an operation in the control unit illustrated in FIG. 1 to detect an open-phase in a reactor. Before running a normal control sequence, the control unit 11 turns on three MOSFETs 6a, 6b, and 6c in the described order at a predetermined power phase for a predetermined number of seconds in order to lead a current via each phase. At this time, the control unit 11 detects the bus current Idc input via the second filter circuit 13, and determines whether a value of the detected bus current Idc falls within a predetermined range in order to determine whether there is an open-phase.

FIG. 3 is an explanatory diagram of the details of the control in the control unit illustrated in FIG. 1. FIG. 3 illustrates, from top to bottom, a voltage waveform Vin of the AC power supply 1, the respective PWM drive signals X, Y, and Z for the MOSFETs 6a, 6b, and 6c, and the bus current Idc of the bus-current detection circuit 10 input to the control unit 11 via the second filter circuit 13.

In FIG. 2, upon receiving an operation start signal (S1), the control unit 11 starts detecting whether there is an open-phase prior to the start of operation (S2).

The control unit 11 turns on three MOSFETs 6a, 6b, and 6c in the described order at a predetermined power phase for a predetermined number of seconds. At this time, a current that flows after the three MOSFETs 6a, 6b, and 6c have been sequentially turned on is detected by the bus-current detection circuit 10 via the second filter circuit 13. As illustrated in FIG. 3, the control unit 11 determines whether the bus current Idc that is a current value detected by the bus-current detection circuit 10 falls within a predetermined current range R (S3).

When the current value falls within the predetermined current range R (YES at S3), the control unit 11 shifts to an operation start sequence (S4).

When the current value does not fall within the predetermined current range R (NO at S3), the control unit 11 determines that an open-phase fault has occurred in a reactor, and therefore does not shift to the operation start sequence (S5).

After having shifted to the operation start sequence at S4, the control unit 11 uses the bus current Idc detected via the first filter circuit 12 to execute a feedback control.

In a typical conventional booster circuit such as disclosed in Patent Literature 1 in which a plurality of series circuits, each of which includes a reactor and a switching element, are connected in parallel, there is a possibility that an open-phase may occur due to improper wiring in the reactor, a break of a wire in the reactor, or a fault in the switching element. If the boosting operation is continued in an open-phase state, a load is concentrated on some of the reactors and the switching elements, which increases the amount of heat generated. This may shorten the service life of the components. The converter device 100 according to the present embodiment detects an open-phase in a booster circuit regardless of the value of a reactor that constitutes the booster circuit, and can therefore prevent the booster circuit from operating in an open-phase state. In accordance with the converter device 100, even when an open-phase has been detected, the components can still be prevented from being damaged, and consequently a reduction in the service life of the components can be prevented.

If an open-phase has occurred in a conventional booster circuit represented by Patent Literature 1, this hinders an air conditioner from continuously operating, impairs the comfort for users, and impairs energy saving. In contrast thereto, the motor drive device 300 according to the present embodiment is used in an air conditioner, and this provides an effect of improving the comfort for users, and improving energy saving without hindering the air conditioner from continuously operating. Similarly, the motor drive device 300 according to the present embodiment is used in a refrigerator or a heat-pump water heater, and this provides an effect of improving energy saving.

In the booster circuit 20 according to the present embodiment, a chopper circuit group 22 constituted by three chopper circuits is used. However, it is sufficient that the chopper circuit group 22 is configured to be capable of boosting an output voltage of the rectifier circuit 4. Therefore, the chopper circuit group 22 may be constituted by two chopper circuits, or four or more chopper circuits.

Although the booster circuit 20 according to the present embodiment uses a MOSFET as an example of the switching elements, the switching elements constituting the booster circuit 20 is not limited to a MOSFET as long as a switching operation can be performed, and an IGBT (Insulated Gate Bipolar Transistor), an IGCT (Insulated Gate Controlled Thyristor), or an FET (Field Effect Transistor) can be also used for the switching elements.

In the present embodiment, the AC power supply 1 that is a single-phase AC power supply is used, and the rectifier circuit 4 that is a single-phase rectifier circuit is used. However, the AC power supply 1 may be a three-phase AC power supply. In a case where a three-phase AC power supply is used as the AC power supply 1, a three-phase rectifier circuit may be used as the rectifier circuit 4.

In the booster circuit 20 according to the present embodiment, the diode group 7 is used as a backflow prevention element. However, the backflow prevention element is not limited to the diode group 7. In the booster circuit 20, a switching element such as an IGBT, an IGCT, or an FET may be used as a backflow prevention element instead of the diode group 7, as long as the element functions as a backflow prevention element.

The configurations described in the above embodiment are only examples of the content of the present invention. The configurations may be combined with other well-known techniques, and a part of each configuration may be omitted or modified without departing from the scope of the present invention.

The invention claimed is:

1. A converter device comprising:
a rectifier circuit to rectify an AC voltage output from an AC power supply;
a booster circuit including a plurality of reactors, a plurality of switching elements, and a plurality of backflow prevention elements to boost an output voltage of the rectifier circuit;
a smoothing capacitor to smooth an output voltage of the booster circuit;
a current detection circuit to detect a value of a current that flows between the rectifier circuit and the booster circuit;
a first filter circuit having a first filter time constant;
a second filter circuit having a second filter time constant shorter than the first filter time constant; and
a control unit to control an operation of the plurality of switching elements by inputting a current value detected by the current detection circuit to the control unit via the first filter circuit and the second filter circuit, wherein
the control unit determines whether there is an open-phase by determining whether the current value, input via the second filter circuit when the plurality of switching elements are turned on sequentially, falls within a predetermined current range.

2. A motor drive device comprising:
the converter device according to claim 1; and
an inverter device to convert DC power output from the converter device to AC power, and to supply the AC power to a motor.

3. A refrigerator comprising the motor drive device according to claim 2.

4. An air conditioner comprising the motor drive device according to claim 2.

5. A heat-pump water heater comprising the motor drive device according to claim 2.

* * * * *